United States Patent [19]

Patch

[11] Patent Number: 4,663,599
[45] Date of Patent: May 5, 1987

[54] INTEGRATED CIRCUIT AMPLIFIER MODULE

[75] Inventor: Richard J. Patch, Lynchburg, Va.

[73] Assignee: General Electric Company, Lynchburg, Va.

[21] Appl. No.: 736,574

[22] Filed: May 21, 1985

[51] Int. Cl.$^4$ ............................................ H03F 3/343
[52] U.S. Cl. ................................... 330/311; 330/307; 330/310
[58] Field of Search ............... 330/288, 302, 307, 310, 330/311

[56] References Cited

U.S. PATENT DOCUMENTS

| | | | |
|---|---|---|---|
| Re. 30,297 | 6/1980 | Wittlinger | 330/288 |
| 3,392,342 | 7/1968 | Ordower | 330/288 |
| 3,626,313 | 12/1971 | Zuk | 330/288 |
| 3,942,129 | 3/1976 | Hall | 330/288 |
| 3,950,708 | 4/1976 | Hall | 330/288 |
| 3,952,257 | 4/1976 | Schade, Jr. | 330/288 |
| 3,992,676 | 11/1976 | Knight | 330/288 |
| 4,028,631 | 6/1977 | Ahmed | 330/310 X |
| 4,140,977 | 2/1979 | Ahmed | 330/288 |
| 4,237,414 | 12/1980 | Stein | 330/288 |
| 4,240,041 | 12/1980 | Hashimoto et al. | 330/288 |
| 4,242,643 | 12/1980 | Leidich | 330/288 |

OTHER PUBLICATIONS

Gray et al., *Analysis and Design of Analog ICs*, J. Wiley & Sons, Sec. 3.3.2, pp. 155–158.

Horowitz et al., *The Art of Electronics*, Cambridge V. Press, pp. 84, 85, 250, 251, 560–562 and 568–569.

*Primary Examiner*—Eugene R. LaRoche
*Assistant Examiner*—Steven J. Mottola
*Attorney, Agent, or Firm*—Nixon & Vanderhye

[57] ABSTRACT

A four-terminal integrated circuit high-frequency RF amplifier connects to external circuitry via a ground terminal, and RF input terminal, an RF output terminal and a DC biasing terminal. A two stage amplification architecture is employed—a current gain transistor (common-emitter) is cascoded with a subsequent voltage gain transistor (common-base) while yet maintaining RF signal inversion overall from input to output so as to increase stability. A biasing current-mirror transistor provides biasing current to the current-gain transistor. A fourth transistor connected as a forward-biased collector-base shorted diode between the current mirror biasing transistor and a common external biasing terminal supplies bias current to the current-mirror biasing transistor while simultaneously minimizing voltage swings across the current-gain transistor. The amplifier module has very low input capacitance which does not change appreciably with changes in load impedance, and operates with great stability under a wide range of different input and output conditions and RF frequencies. Because of its relative simplicity and compactness, the amplifier can be used to great advantage as an IC "building block" in a variety of different applications.

37 Claims, 15 Drawing Figures

R2 = 5 SERIES CONNECTED 1KΩ RESISTORS
R1 = 1KΩ RESISTOR
(1K RESISTOR LENGTH = 33μ, WIDTH = 20μ, LAYER 04 Ps = 500Ω/☐)
R3 = 300Ω (LENGTH 50μ, WIDTH = 20μ, LAYER 13, Ps = 100Ω/☐)

10 MW EXCITER

EA
10 MW EXCITER

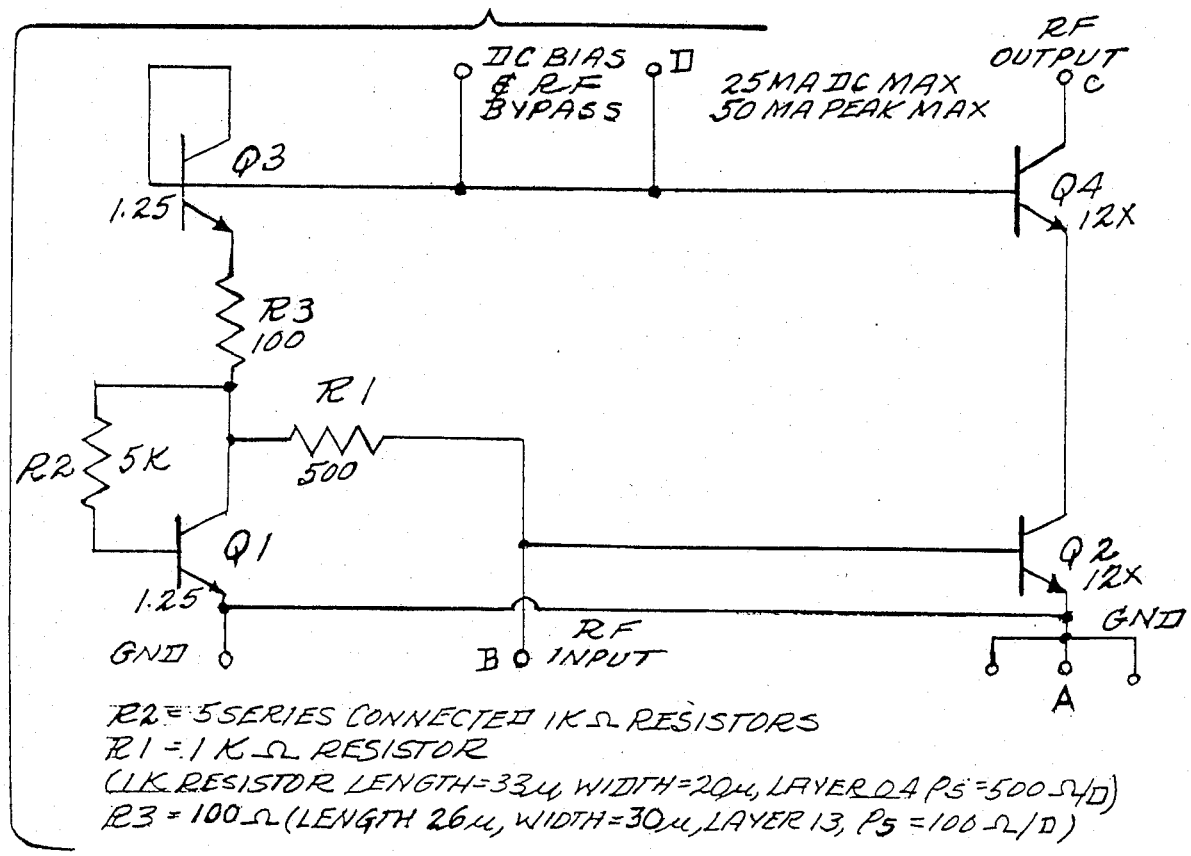
FIG. 6A 50 MW EXCITER
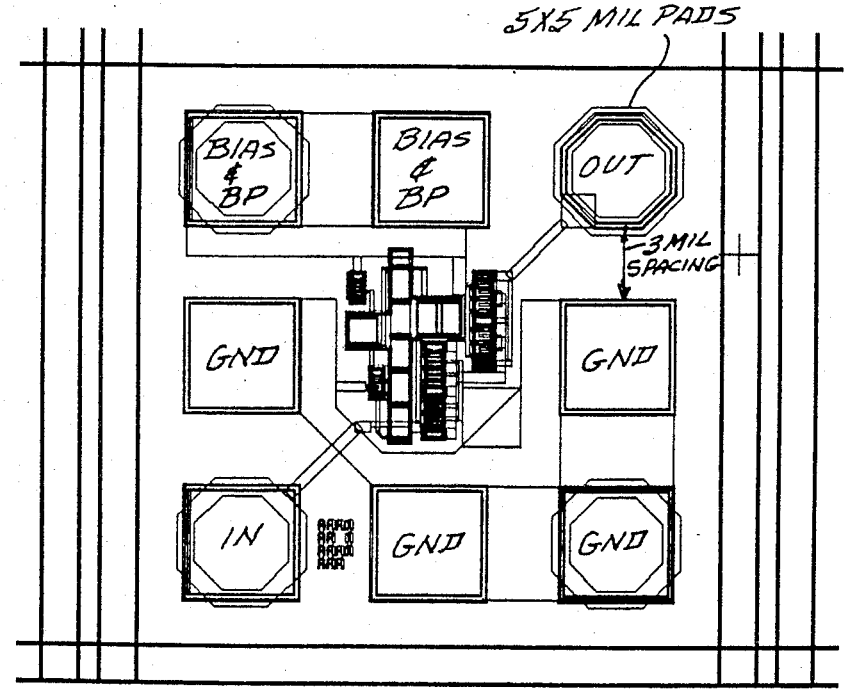
FIG. 6B EB 50 MW EXCITER

EB
50 MW EXCITER

FIG. 7A 150 MW EXCITER

R2 = 4 SERIES CONNECTED 340Ω RESISTORS
R1 = 2 PARALLEL CONNECTED 340Ω RESISTORS
(340Ω RESISTORS, LENGTH = 56.5μ, WIDTH = 20μ, LAYER 13 ρs = 100 Ω/□)
R3 = 30Ω (LENGTH 13μ, WIDTH 50μ, LAYER 13 ρs = 100 Ω/□)

EC 150 MW EXCITER

34 X 34 MIL CHIP

EC
150 MW EXCITER

INTEGRATED CIRCUIT AMPLIFIER MODULE

FIELD OF THE INVENTION

The present invention is related to integrated circuit radio frequency amplifiers. It is particularly related to a general purpose IC module which can be used as an IC "building block" to provide high quality RF amplification in a multitude of specific applications including high frequency (e.g. 1 GHz) applications.

BACKGROUND OF THE INVENTION

A radio frequency amplifier has at least two principal functions. It must first amplify an input RF signal by an accurately known gain factor to produce a desired output level. Secondly, the input and output RF signals must be efficiently coupled into and out of the amplifier at the desired RF frequency (often over a broad band of frequencies) with little or no mismatch in RF impedances. For example, the output amplifier stage must efficiently couple an amplified r.f. signal to an RF load connected to its output terminals. The output stage must be capable of delivering the desired amount of RF signal power to the load with acceptably low levels of signal distortion if the amplifier is operated in a linear class (e.g., class A, class AB or class B). Moreover, the output stage should have a gain that is not greatly dependent upon load impedance. A well-designed RF output amplifier stage should achieve these performance specifications while consuming low quiescent power, providing stable operation under all expected input and output conditions, and without limiting the frequency response of the amplifier. Unfortunately, these (and perhaps other) well known desired performance specifications often can be difficult to simultaneously obtain from RF amplifier stages operated at very high frequencies (e.g., on the order of hundreds of MHz and in the GHz ranges).

In high-frequency RF communications equipment, considerable expense and circuitry has typically been necessary to design and construct intermediate amplifier stages which can develop sufficient power to drive high-power output stages. At high frequencies, stability problems become so severe that often per stage gains of only 5 to 8 dB are practical. The associated per stage band limiting components are generally expensive and consume precious space in modern RF communications equipment (miniaturization and minimization of which is usually desirable for a number of reasons).

Stability problems are primarily caused by uncertain amounts of reflected feedback impedance related to the effective capacitance of the active components in addition to layout-dependent stray capacitance. Furthermore, the feedback capacitance (commonly referred to as "Miller" capacitance) is one of the primary causes of changes in amplifier input impedance as load impedance varies with frequency.

Unavoidable capacitance between the collector and the base structures of a bipolar junction transistor (or between the source and the gate for a field-effect transistor) can cause a relatively large effective capacitance (the elemental component capacitance multiplied by 1 plus the voltage gain of the stage) to appear in parallel with the input to the transistor. The process by which the component capacitance is magnified and presented in parallel with the input terminals is often referred as the Miller effect. The Miller effect can reduce the unity-gain crossover frequency (gain-bandwidth product) of a transistor amplifier substantially if the amplifier is not well-designed. Because the amount of Miller feedback capacitance is related to stage gain, such feedback capacitance increases as the stage gain increases. In the case of a tuned load, this effective input capacitance typically can vary widely. In a production environment, these uncertain capacitances vary from one lot of amplifiers to another, often requiring expensive and critical manual tuning and/or manual "trimming" of passive components.

An additional need to conserve DC power exists whenever an amplifier stage is to be used in battery-operated equipment. Excess DC current is typically required so as to set the DC bias current of an RF amplifier stage at an appropriate level to insure a desired RF output power. (Such excess current is, for example, sometimes required to overcome biasing changes caused by expected transistor gain variations between different units in a large scale manufacturing environment.) Unfortunately, such excess current, when drawn from a battery power supply, can seriously shorten the life of the power supply, thereby reducing equipment reliability and increasing equipment maintenance costs.

FIG. 1 is a schematic diagram of one commonly-used prior art discrete high-frequency power amplifier 10. An input signal to is coupled to amplifier 10 via a coupling capacitor 12 and a matching network 14 (the purpose of which is to match the input impedance of the amplifier with the impedance of the signal source and thereby obtain more efficient signal transfer). The RF output of amplifier 10 is coupled from the collector of transistor 20 to a load 16 via another coupling capacitor 18. Amplifier 10 typically includes a bipolar junction transistor 20 connected in the common-emitter configuration, a radio frequency (RF) choke 22 (L1), bias voltage divider resistors 24 and 26, and an RF bypass capacitor 28. Supply voltage $V_{cc}$ is connected to the collector of transistor 20 via RF choke 22 which, together with bypass capacitor 28, prevent significant RF energy from reaching the power supply.

While the circuit configuration shown in FIG. 1 is extremely useful in a wide variety of different applications, it also has a lot of disadvantages—all of which become more critical as operating frequency increases and/or as the desired frequency band of operation is broadened. The input and output capacitance of amplifier 10 may be unacceptably high due to the Miller effect discussed above. Moreover, input and output capacitance may vary widely with amplifier instantaneous gain, load, signal level and frequency. There is a trade-off in amplifier 10 between stability and high gain which seriously limits the maximum power gain that can be expected. Moreover, implementation of amplifier 10 in an integrated circuit environment poses still further problems, since wire bonding inductance can become critical at high power levels and result in higher packaging costs. An integrated circuit implementation of amplifier 10 typically also requires the back surface of the integrated circuit chip to be tied to the output terminal, and thus requires ground isolation techniques to be used in the "packaging" of the IC chip.

Other high-frequency amplifier circuits exist which are better adapted for implementation in an integrated circuit format. For instance, U.S. Pat. No. 4,240,041 to Hashimoto et al (1980) discloses a high-frequency amplifier circuit capable of being integrated onto a single semiconductor chip. The output transistor of the amplifier disclosed may be operated in class AB, B or C by setting circuit parameters as desired. Moreover, the amplifier disclosed in this reference can be placed on a chip having relatively few (5) leads. However, the disclosed amplifier circuit uses double inversion (i.e., the output voltage is of the same polarity as the input voltage), thereby creating the possibility that positive feedback from the output to the input terminal may cause instability at high frequencies. Moreover, the amplifier gain is a complex function of the biasing resistance and the relative areas and transconductances of the various transistors used in the circuit. Finally, the biasing resistance must be relatively small to mask expected variations in transistor gains, thus causing power to be wasted.

Other examples of prior art possibly relevant to the present invention include (and there may be many more):

U.S. Pat. No. 3,392,342 to Ordower—(1968);
U.S. Pat. No. 3,626,313 to Zuk—(1971);
U.S. Pat. No. Re. 30,297 to Wittlinger—(1980);
U.S. Pat. No. 3,992,676 to Knight—(1976);
U.S. Pat. No. 3,942,129 to Hall—(1976);
U.S. Pat. No. 3,950,708 to Hall—(1976);
U.S. Pat. No. 3,952,257 to Schade, Jr.—(1976);
U.S. Pat. No. 4,028,631 to Ahmed—(1977);
U.S. Pat. No. 4,140,977 to Ahmed—(1979);
U.S. Pat. No. 4,237,414 to Stein—(1980); and
U.S. Pat. No. 4,242,643 to Leidich—(1980).

The patents listed above disclose various bipolar junction transistor configurations which can be used in high-frequency amplifier applications. For instance, U.S. Pat. No. 3,392,342 to Ordower discloses current mirror biasing. Zuk teaches a current mirror amplifier employing scaled geometries for the input and output transistors and using a cascaded output arrangement. Wittlinger teaches a current mirror amplifier which maintains collector potentials of the input and output transistors at equal levels. Knight shows a current mirror amplifier similar to Wittlinger's with a self-biased cascaded output stage. Ahmed '631 teaches a current mirror amplifier having a collector-base shunted input biasing resistor used to reduce input impedance.

Despite the recent advantages in integrated circuit technology, and despite the existence of a multitude of prior art circuits such as those identified above, no monolithic (i.e. integrated circuit) RF amplifier building blocks previously have been developed which can provide truly accurate and relatively high gain and power levels over a very wide band of high RF frequencies while yet permitting accurate control of DC output current for a given DC input current and minimizing the DC input power for a given RF output power. Moreover, most integrated-circuit high-frequency amplifier stages which have been proposed have significant high-frequency stability problems due to excessive input capacitance which changes over a large range with changing load impedance. Critical factory trim of individual components due to capacitance variations in active amplifier elements typically has been necessary, in the past, to obtain desired gain factors, and cascaded stages are typically needed to drive RF power devices or modules even when such trimming techniques are employed. No integrated circuit building block has previously been available which solves all of these problems at low cost and low complexity. Such a building block, if available, could be used in a variety of RF communications equipment product lines including mobile, cellular and hand-held battery communications equipment. If such a building block were capable of achieving stability at high efficiency, it would be ideal for use in a wide variety of different applications in such equipment, such as for RF preamplification, RF power drivers, RF power modules, and receiver mixers or IF amplifiers.

SUMMARY OF THE INVENTION

The present invention provides a high-frequency integrated circuit RF amplifier which provides an accurate and high gain over a wide band of RF frequencies, uses DC input power very efficiently, is stable at even very high RF frequencies (i.e. beyond 1 GHz) and has significantly reduced input capacitance which is largely independent of load impedance. In very brief summary the new amplifier module includes two cascaded stages of amplification—current gain followed by voltage gain. The input current gain stage is biased by a current mirror arrangement which is in turn, fed by a forward-biased diode (e.g. a shorted collector-base transistor) having a stable voltage drop thereacross. The diode provides temperature compensation while also maintaining a relatively low voltage across the current-gain stage and thus minimizing the voltage swing across the cascoded voltage-gain stage.

An amplifier in accordance with the present invention may simply include four transistors, preferably fabricated on the same semiconductor wafer. Only four externally accessible leads (i.e. IC "pads") need be provided to provide full external access to the amplifier chip (although plural pads may be provided in parallel connections to some of the four terminal points so as to minimize inductance and/or to maximize conductance of wire bonds). Because only four connections to the external world are required, the entire module can be very advantageously "packaged" in a conventional four-leaded "Micro-X" IC package/carrier.

First and second transistors (Q1 and Q2) are connected together in a current mirror configuration. (That is, the emitter areas of the first and second transistors are scaled and the electrodes are interconnected so that the current flowing through the second transistor Q2 is a multiple of the current flowing through the first transistor Q1.) The first current-mirror transistor Q1 acts to bias the second transistor Q2. A third transistor Q3 (collector-base shorted diode) feeds DC bias supply to the current mirror coupled first and second transistors and also provides an accurate voltage drop to ensure that the second transistor Q2 (the current gain stage) properly operates in its active region (i.e., is not saturated). The second transistor Q2 (common-emitter current gain) and a fourth transistor Q4 (common-base to provide voltage gain) are connected together in a cascode configuration and the voltage drop across the Q3 diode also tends to minimize collector-emitter voltage swings across Q2 while maximizing collector-emitter voltage swings across Q4.

As noted, the second transistor Q2 provides current gain, while the fourth transistor Q4 provides voltage gain. The instantaneous current flowing through the fourth transistor Q4 is a function of the current flowing through the second transistor Q2. The quiescent operating points of both amplifying transistor stages can be simultaneously controlled via a common bias terminal. Hence, the power of the output signal produced by the amplifier is directly controlled by the input signal level, with a very accurate gain relationship established by the scaled geometries of the first and second transistors Q1 and Q2 (i.e. the current mirror). A relatively high breakdown voltage is established across the fourth transistor Q4 due to the cascode connection with a current gain stage Q2. Moreover, very little load capacitance is reflected from the RF load back to the input of the fourth transistor Q4, providing a relatively low input capacitance which does not vary much with load impedance.

Because the new amplifier module is also an inverting amplifier (even though it uses two cascoded gain stages), there is significantly reduced possibility that output-to-input signal feedback can cause oscillation.

Output stage DC current is tightly controlled by the input biasing current, so that power control is obtained without sacrificing efficiency. Extremely broadbanded operation at relatively high, accurate gains can be obtained (e.g. 15 dB of gain at 900 MHz changing smoothly to 25 dB of gain at 100 MHz).

Because of the uniquely advantageous combination of high quality performance characteristics, simplicity and low cost of an IC amplifier constructed in accordance with the present invention, it is anticipated that the amplifier will find wide use as a "building block" in many different applications including but not limited to RF communications circuits.

BRIEF DESCRIPTION OF THE DRAWINGS

These and other objects and advantages of the present invention will be better understood by carefully reading the following detailed description of the presently preferred exemplary embodiments of this invention taken in conjunction with the accompanying drawings of which:

FIGS. 6A, 6B and 6C correspond to FIGS. 5A–5C respectively but for an exemplary 50 milliwatt version of the FIG. 3 embodiment;

FIGS. 7A, 7B and 7C also correspond to FIGS. 5A–5C respectively but for an exemplary 150 milliwatt version of the FIG. 3 embodiment;

DETAILED DESCRIPTION OF THE PREFERRED EMBODIMENTS

Figure 1:
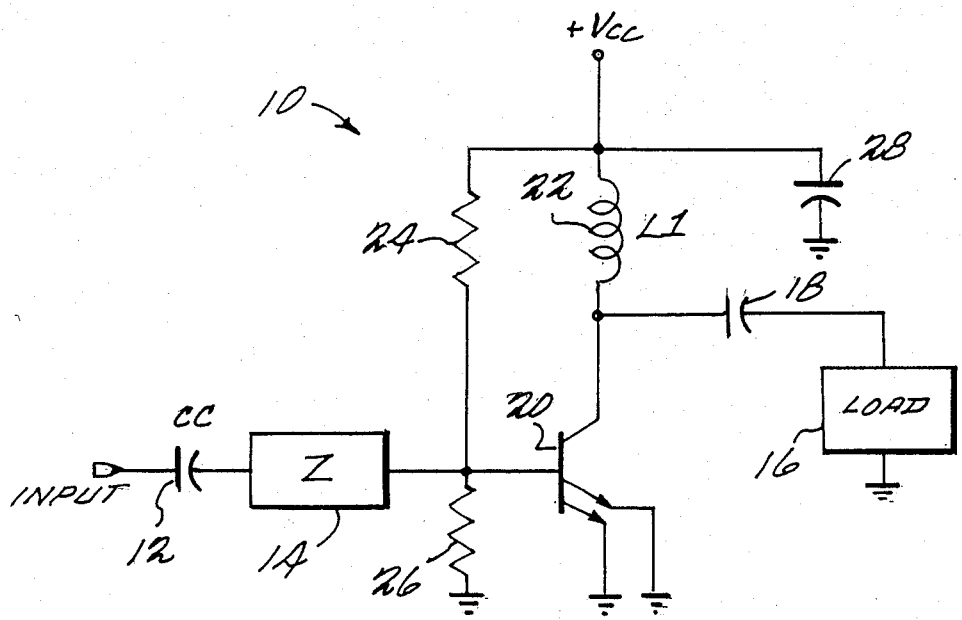
FIG. 1 is a schematic diagram of one typical type of prior-art high-frequency RF radio frequency amplifier.
Figure 4:
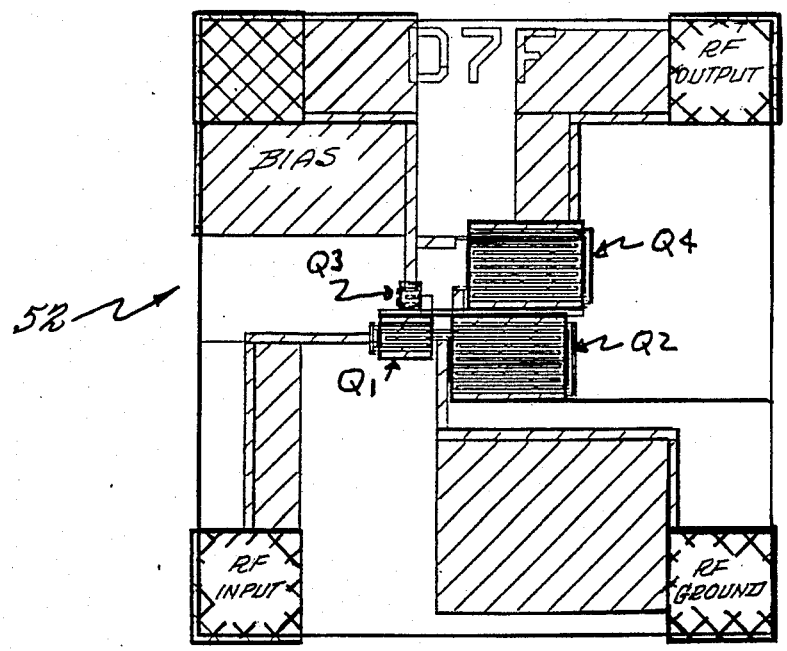
FIG. 4 is a top view (e.g. a computer generated overlay drawing of the IC masks) of an exemplary layout of an integrated circuit chip which may be utilized to realize the embodiment of FIG. 2 (resistance 54 is included within the structure of transistor Q3 in this embodiment)
Figure 2:
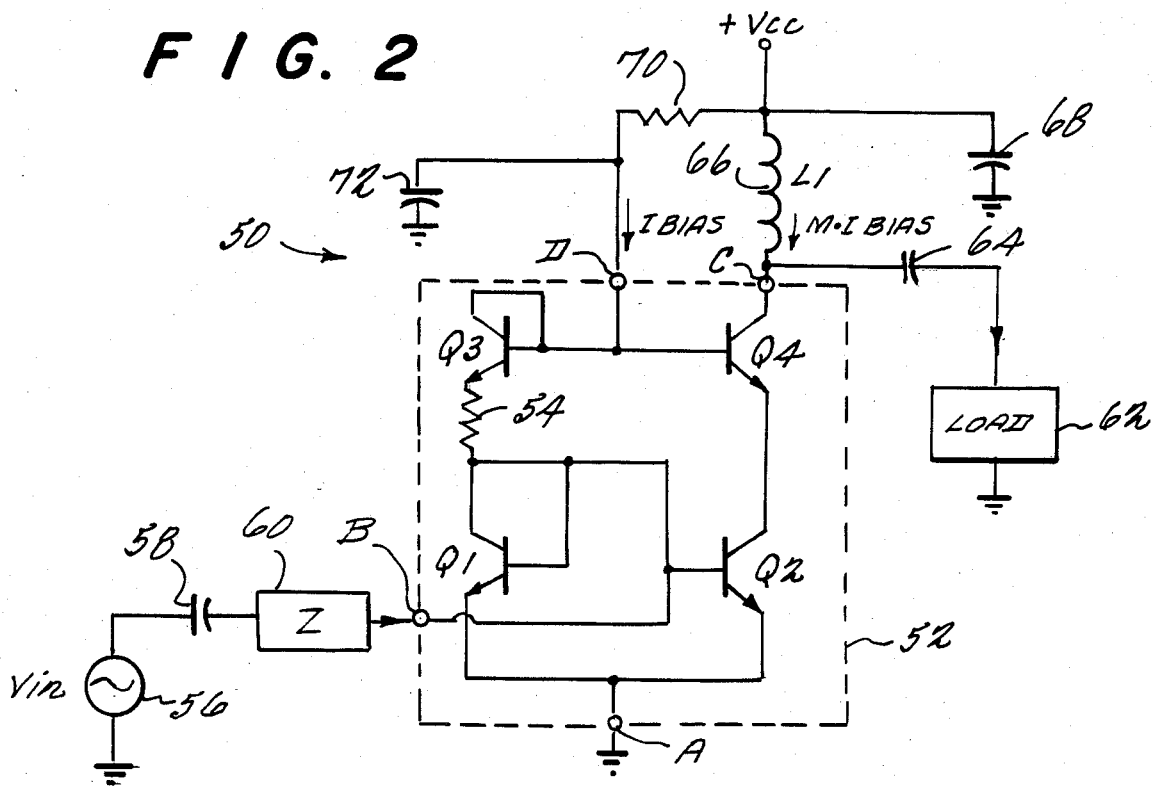
FIG. 2 is a schematic diagram of a first exemplary embodiment of an integrated circuit RF amplifier in accordance with the present invention.

FIG. 2 is a schematic diagram of a first exemplary embodiment of the new amplifier 50. The active components of amplifier 50 may be fabricated on a single integrated circuit semiconductor wafer 52 (using conventional integrated circuit layout and construction techniques) and connected to external circuitry by only four terminals (i.e. IC "pads") A–D. In the preferred embodiment, terminal A is a grounding lead, terminal B is an input lead, terminal C is an output lead and terminal D is a biasing lead. Because of the small number of leads required to connect the components fabricated on wafer 52 with external components, amplifier 50 can be produced using a small conventional 4-leaded IC chip package (e.g. a "Micro-X" package carrier). One possible chip layout is illustrated in FIG. 4.

Four transistors Q1, Q2, Q3 and Q4 are fabricated on wafer 52 in the preferred embodiment. Although all of the transistors shown in FIG. 2 are NPN bipolar junction transistors, PNP bipolar junction transistors or field effect transistors (FET) could be used instead (in the latter instance, base-collector-emitter structures become gate-drain-source FET structures as will be appreciated). In FIG. 2, the emitter of Q1 is connected to ground terminal A, while the base of Q1 is connected to its collector. The emitter of Q2 is connected to ground terminal A, while the base of Q2 is connected to the base (and hence also to the collector) of Q1. Input terminal B is connected to the commonly-connected base of Q2 and to the base and collector of Q1.

The collector of Q1 is connected through an emitter resistor 54 (which preferably is fabricated by diffusion or by some other conventional method and/or may be included as a part of the transistor Q3 structure on wafer 52 by purposefully making lossy junction electrode lead structures) to the emitter of Q3. The collector of Q3 is connected to its own base, so that Q3 functions as a collector-base shorted diode. The bases of Q3 and Q4 are both connected to the DC biasing input terminal D. The emitter of Q4 is connected to the collector of Q2, while the collector of Q4 is connected to the RF output terminal C.

In a typical application, an RF signal source 56 is coupled to input terminal B through coupling capacitor 58 and a conventional matching network 60. Coupling capacitor 58 serves to prevent DC levels from being coupled between input terminal B and source 56, while matching network 60 matches the input impedance of source 56 to the input impedance appearing at input terminal B. An RF load 62 is connected to output terminal C through a series-connected coupling capacitor 64. An RF choke 66 is connected in series between output terminal C and a power supply voltage $V_{cc}$ to block RF energy from flowing to the power supply. A bypass capacitor 68 is connected between $V_{cc}$ and ground potential to provide an RF ground. A biasing resistor 70 is connected between $V_{cc}$ and biasing terminal D. Alternatively, a controlled bias current source may be directly connected to supply terminal D. A relatively-large bypass capacitor 72 connected between biasing terminal D and ground potential ensures that the biasing terminal D is at RF ground potential. Grounding terminal A is connected directly to DC and RF ground potential.

Transistors Q1 and Q2 have scaled geometries to provide an accurate relationship between the input DC bias current and the DC current in the output amplifier stages Q2, Q4. For example, if the emitter of transistor Q1 is made to have a relative size of 10× and the emitter of Q2 is made to have a relative size of 100×, the multiplied current M·$I_{bias}$ flowing through transistor Q2 will be very nearly 10 times the DC input bias current Ibias flowing through transistors Q3 and Q1 (and thus, M is equal to 10). This direct "current mirror" relationship (well known in and of itself) between current in transistor Q2 and biasing current increases the overall efficiency of amplifier 50 and also permits direct control of the amplifier RF power output. For example, the quiescent operating point of amplifier 50 can be varied by simply selecting the value of biasing resistor 70 (or current source). If biasing resistor 70 has a relatively small resistance, amplifier 50 will operate in the linear class A or B mode. On the other hand, amplifier 50 can be set to operate in a class C mode (i.e., where load current is cut off except during input signal peaks) by setting the resistance of biasing resistor 70 to a relatively large value. In this way, efficiency and desired class of amplifier operation can easily be adjusted to suit different applications.

The shorted collector-base junction of Q3 may provide a very low input impedance to the source 56. This is because biasing terminal D is at RF ground (due to the effect of external bypass capacitor 72) and because the collector-base shorted Q3 appears almost as a short circuit to the input source (i.e. the "diode" Q3 is forward-biased to an "on" condition during operation). This very low input impedance also ensures that current gain transistor Q2, in effect, is driven by a low impedance source, causing only a very small voltage swing to be present on the collector of Q2 (and thus yielding very low feedback or "Miller" capacitance to input terminal B). Resistor 54 is provided merely to reduce the loading losses associated with the presence of transistor Q3 (and may in the exemplary embodiment have a value on the order of 30 to 100 ohms).

Transistor (diode) Q3 also serves to bias the collector voltage of transistor Q2 to a value very near ground potential in order to maximize the output voltage swing at the collector of Q4. By maximizing output voltage swing at Q4, the overall output power of amplifier 50 is maximized for a given amount of input DC power, making the amplifier more efficient. Efficiency is especially important if amplifier 50 is provided with power supply voltage $V_{cc}$ from a battery-operated power supply.

Because the base of Q4 is also at RF ground potential (due to external bypass capacitor 72), the RF load impedance seen by the collector of current gain stage Q2 is extremely low. Hence, any changing capacitance reflected to the base of Q4 by the Miller effect (e.g. as a result of a changing load impedance 62) will not be reflected further to the base of Q2. As a result, only extremely low Miller capacitance is reflected to input terminal B.

The input impedance of Q4 is itself very low because it is connected in a common-base configuration. Moreover, transistors Q2 and Q4 are connected in a cascode arrangement so that very high output impedance is presented to output terminal C in order to achieve large amounts of voltage gain from transistor Q4. The cascode arrangement (i.e. current-gain amplifier Q2 feeding voltage-gain amplifier Q4) also results in much lower reflection of variations in the impedance of load 62 to the base of transistor Q4 as well as a higher breakdown voltage across the RF output terminals of the module (which may be useful if load 62 is a tuned circuit, an impedance which is mismatched with the output impedance of amplifier 50, etc.).

An additional power-saving feature of amplifier 50 is derived from the peak rectification action that exists at input terminal B. As the signal produced by source 56 increases, a DC bias voltage is built up across coupling capacitor 58 (or an equivalent capacitance internal to matching network 60) resulting from the rectification action at the base of transistor Q1. This DC bias causes the DC bias current in the output stages Q2 and Q4 to decrease, which thereby increases the efficiency (i.e. the ratio of output RF power to DC input power). By carefully selecting component values, the overall output RF power of amplifier 50 can be made to approach the maximum theoretical value for a given amount of DC input power.

Amplifier 50 is, overall, an inverting amplifier (i.e., a voltage increase at input terminal B causes an voltage decrease at output terminal C). This results because although the common-emitter first stage Q2 inverts, the cascaded common-base second stage Q4 does not. Hence, there is no possibility that positive feedback can occur from output terminal C to input terminal B to cause amplifier 50 to oscillate. Any feedback between output terminal C and input terminal B may decrease amplifier gain somewhat (since this feedback is negative or degenerative feedback), but will enhance rather than decrease the stability of the amplifier.

Amplifier 50 has relatively good temperature stability because transistors Q1–Q4 are all preferably fabricated on the same wafer 52 using similar fabrication techniques. Any temperature change affecting one of the transistors will also affect the other three in the same manner (since each of the elements have the same temperature coefficient). In some instances, biasing resistor 70 may change in resistance with changes in temperature. Also, the base-to-emitter voltage drops across Q1 and Q2 may change somewhat with temperature. However, it has been found that these factors only change the value of $I_{bias}$ by a relatively small amount, so that excellent temperature stability is obtained without requiring extraordinary measures to reduce the temperature change of wafer 52.

Although bipolar NPN transistors are typically constructed with an N-type starting material, I prefer to use a P-type starting material and implant an N-type pocket therein to act as the collector electrode. In this manner, the back of the IC wafer may be directly grounded to simplify the IC packaging and permit improved thermal contact with the IC carrier.

Figure 3:
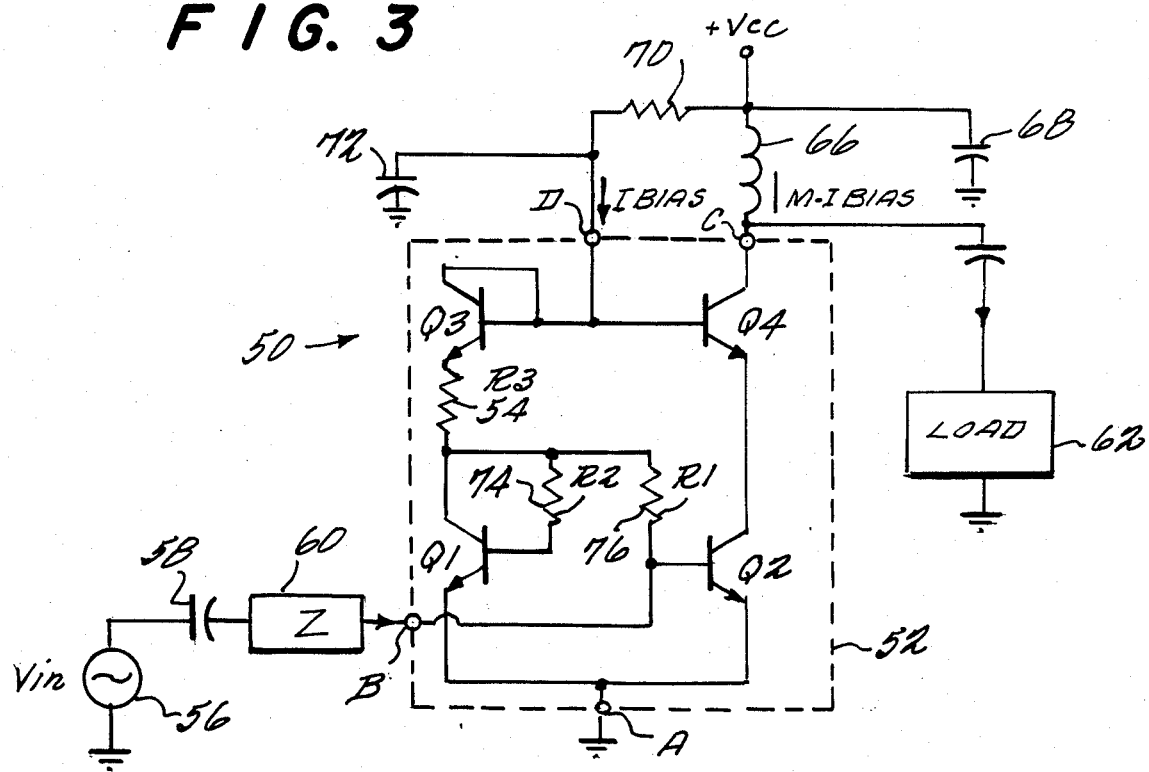
FIG. 3 is a schematic diagram of a second exemplary embodiment of the present invention modified to further reduce input loading effects.

FIG. 3 is a schematic diagram of another further improved (and therefore presently preferred) embodiment of the present invention. The embodiment shown in FIG. 3 is identical in all respects with the embodiment shown in FIG. 2 except that resistors 74 (R2) and 76 (R1) have been added. Resistor 74 is connected between the base of Q1 and it own collector (so that Q1 no longer has its base directly shorted to its collector). Resistor 76 is connected between the base of Q2 and the collector of Q1. Resistors 74 and 76 serve the dual purposes of (1) better isolating the amplifier from input source 56 and (2) maintaining the desired current mirror matching of transistors Q2 and Q1 even though such improved isolation has been provided.

In the embodiment shown in FIG. 2, input terminal B is coupled to the emitter of Q3 through resistor 54 (labeled R3 in FIG. 3). Q3 operates as a forward biased collector-base shorted diode, and thus appears as a near short-circuit to an RF signal applied to input terminal B. The commonly-connected base and collector of Q3 are tied to RF ground (through bypass capacitor 72) at the biasing terminal D. Unless some isolation is provided between input terminal B and the emitter of transistor Q3, excessive loading of the input signal applied to input terminal B may occur under some circumstances.

Resistor 54 (which may be a conventional diffusion-type integrated circuit resistor, or may be conventionally built into the structure of transistor Q3) reduces some of the loading losses associated with the presence of transistor Q3. However, a further resistor 76 may be connected (as shown in FIG. 3) in series between input terminal B and the emitter of transistor Q3 to still further reduce such loading losses and thus even better isolate the input terminal. In effect, the presence of resistor 76 prevents too much input RF power from flowing into collector-base shorted diode Q3 and thus minimizes source loading and permits more efficient use of the RF current applied to input terminal B (as most of this current will now flow as useful RF input to transistor Q2).

As will be recalled, Q1 and Q2 are geometrically scaled in a current mirror configuration, and thus are current matched at a desired ratio. Resistor 74 therefore is added to preserve this current matching. The value of resistor 76 is chosen as desired to provide sufficient input isolation. As will be recalled, the area of transistor Q2 is M times the area of transistor Q1. The value of resistor 74 is thus chosen to be M times the value of resistor 76 to preserve the scaled current-matched relationship between transistors Q1 and Q2. Assuming $\beta_{Q1} = \beta_{Q2}$ (which is generally the case, since these two transistors are fabricated on the same substrate and operate at the same current density), the base current of Q2 is M times larger than the base current of Q1. If resistor 74 is made to be M times larger than resistor 76, the voltage drops across resistors 74 and 76 are the same. In the general case, the resistance of resistor 74 is made to be N times larger than the resistance of resistor 76, where N is the ratio of the area of transistor Q2 to the area of transistor Q1 on the IC chip layout so as to preserve current matching between transistors Q2 and Q1.

Figure 5A:
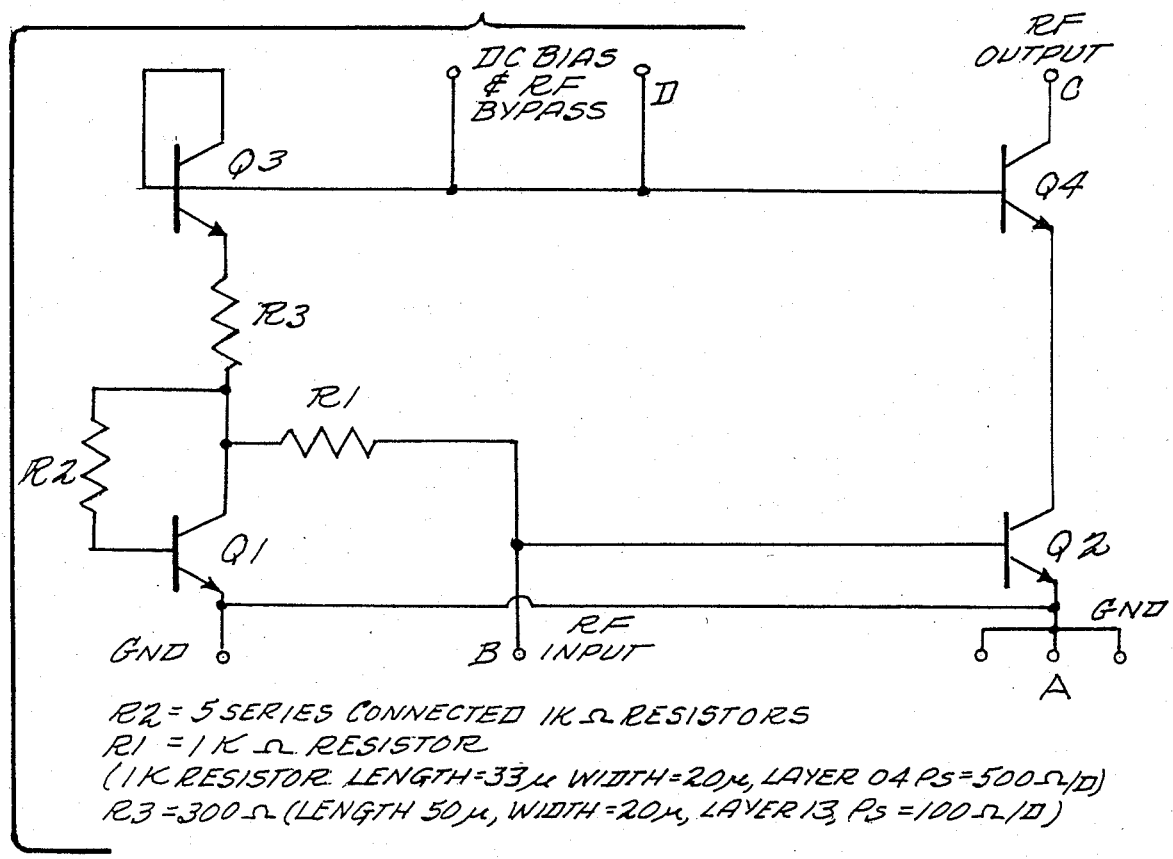
FIGS. 5A, 5B and 5C are, respectively, a schematic circuit diagram, a general top view of an IC chip layout and an exploded top view of the center thereof for an exemplary 10 milliwatt version of the FIG. 3 embodiment.
Figure 5B:
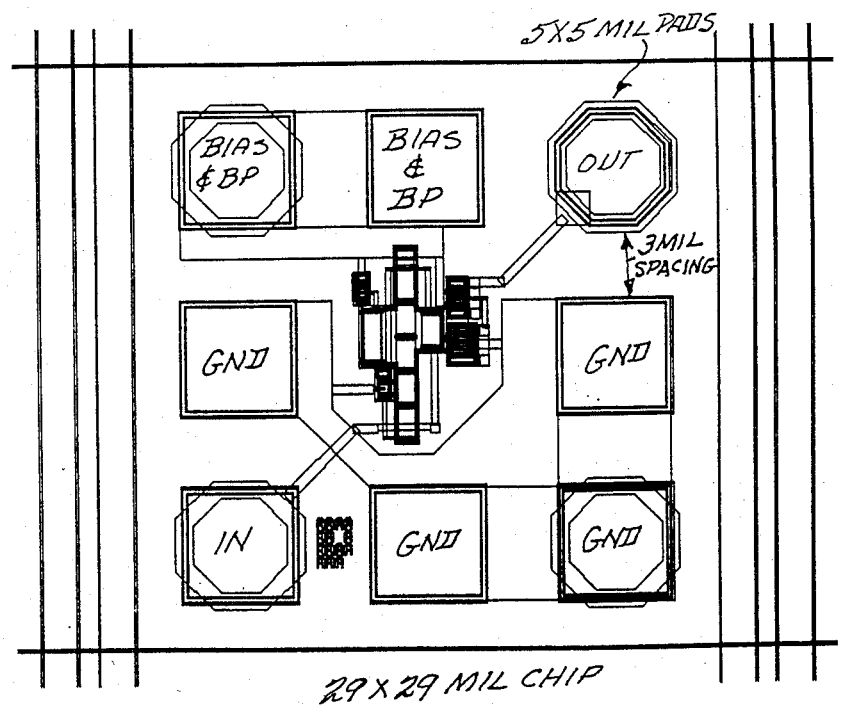
Figure 5C:
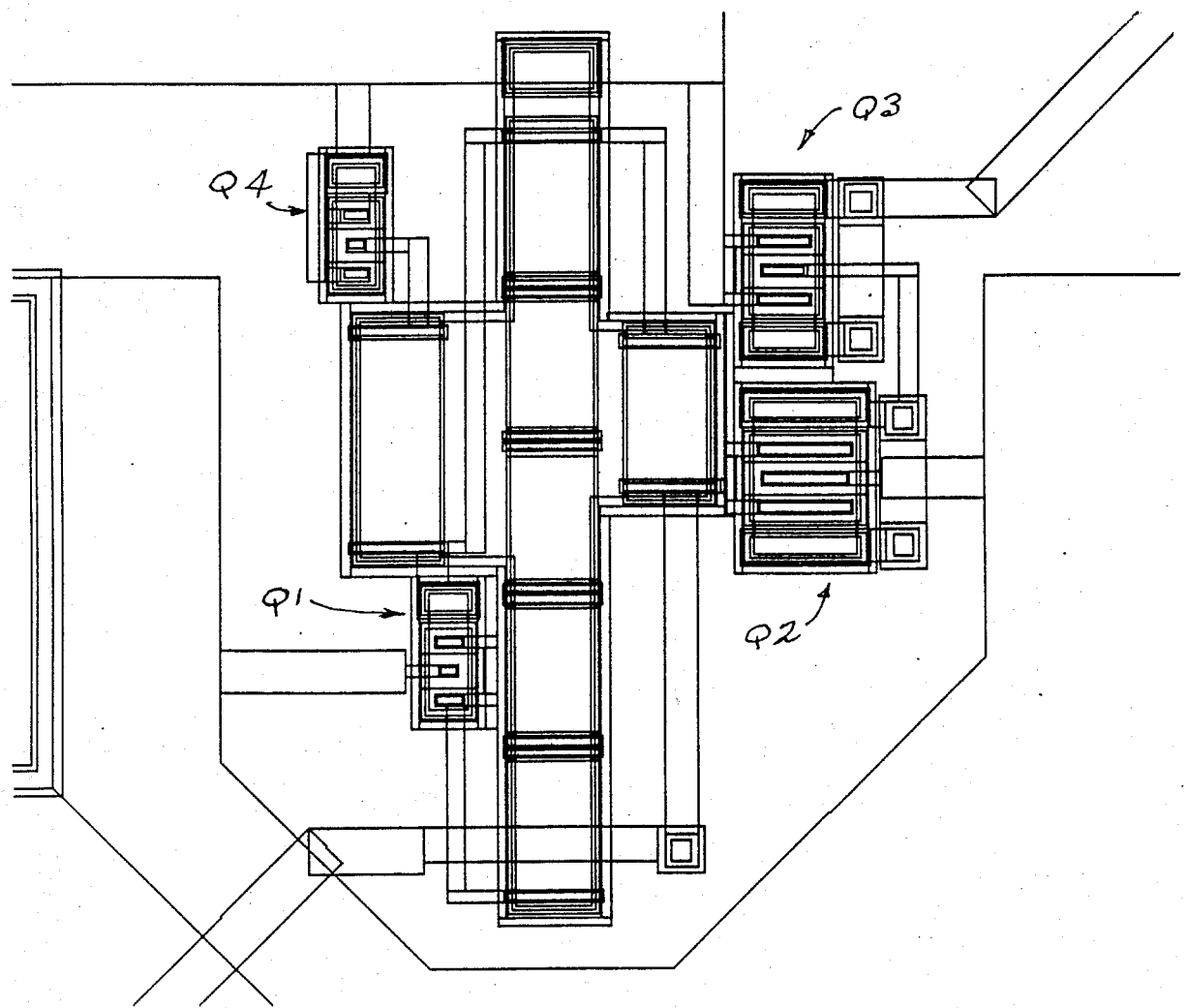
Figure 6C:
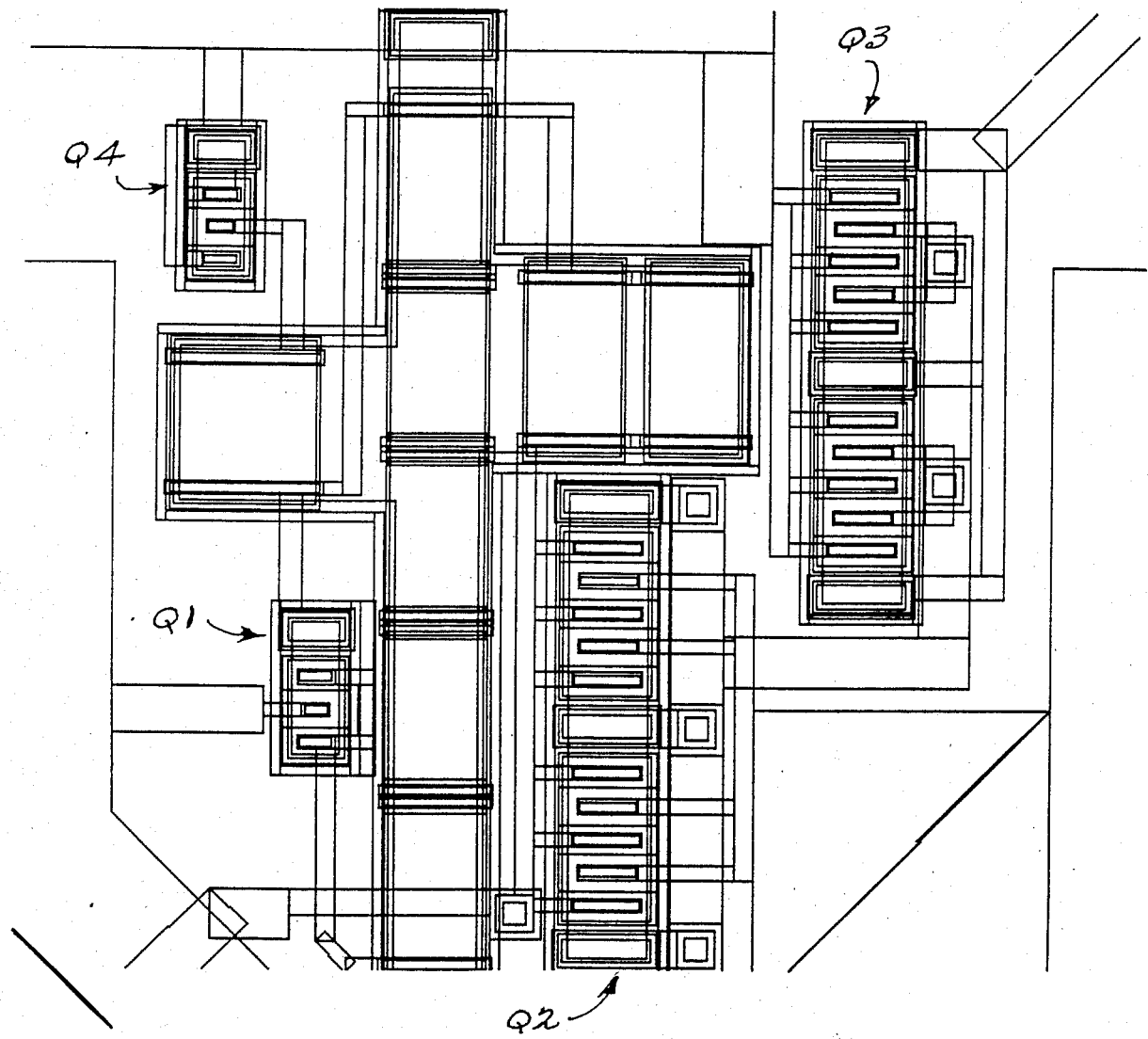
Figure 7B:
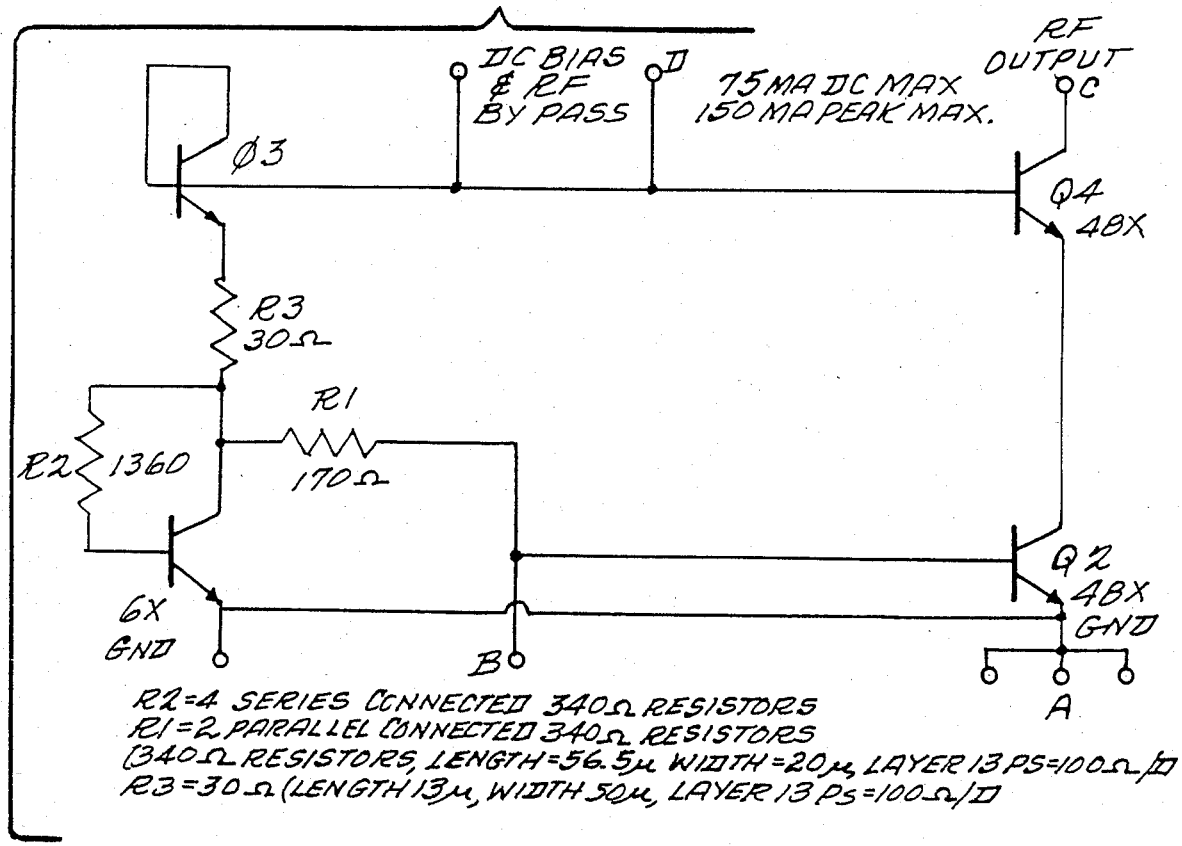
Figure 7B:
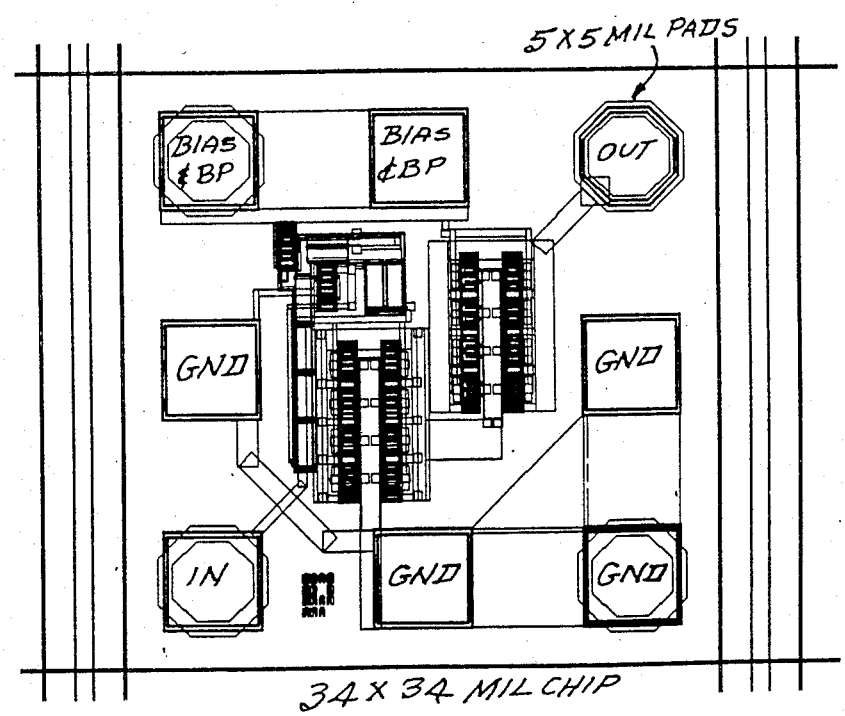
Figure 7C:
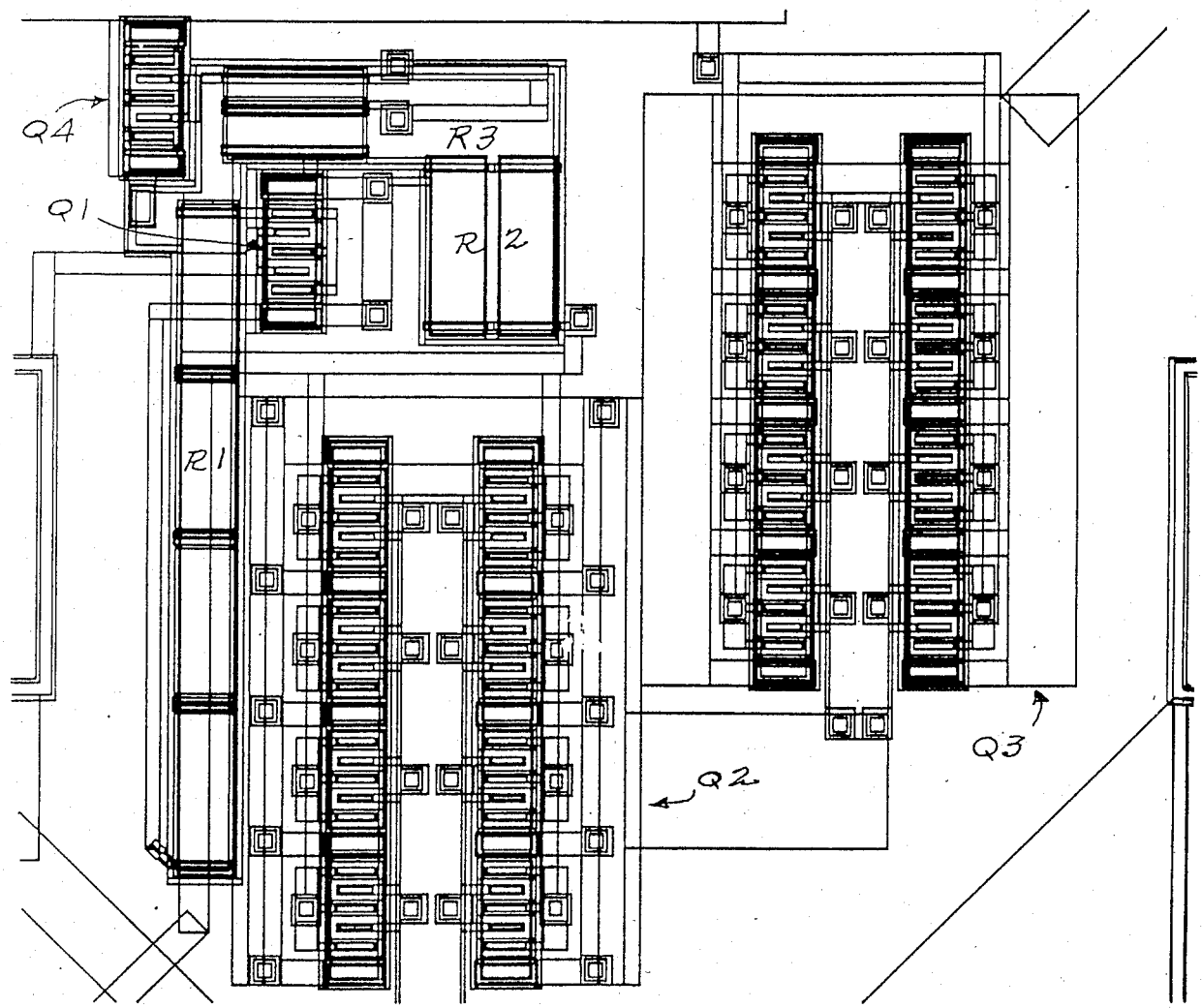

The exemplary FIG. 3 embodiment is illustrated for three specific maximum power levels at FIGS. 5A–5C (10 milliwatts), FIGS. 6A–6C (50 milliwatts) and FIGS. 7A–7C (150 milliwatts). The redrawn schematic diagrams of FIGS. 5A, 6A and 7A include exemplary component values and illustrate extra parallel-connected IC pad connection terminals for the external ground and bias connection points A and D. FIGS. 5B, 6B and 7B provide an overview of an exemplary chip layout at a first scale where the various IC pads are clearly apparent. The central "working" portion of each IC chip layout is shown at enlarged scale at FIGS. 5C, 6C and 7C. Since conventional IC fabrication processes can be employed, no further detail need be given.

Figure 8:
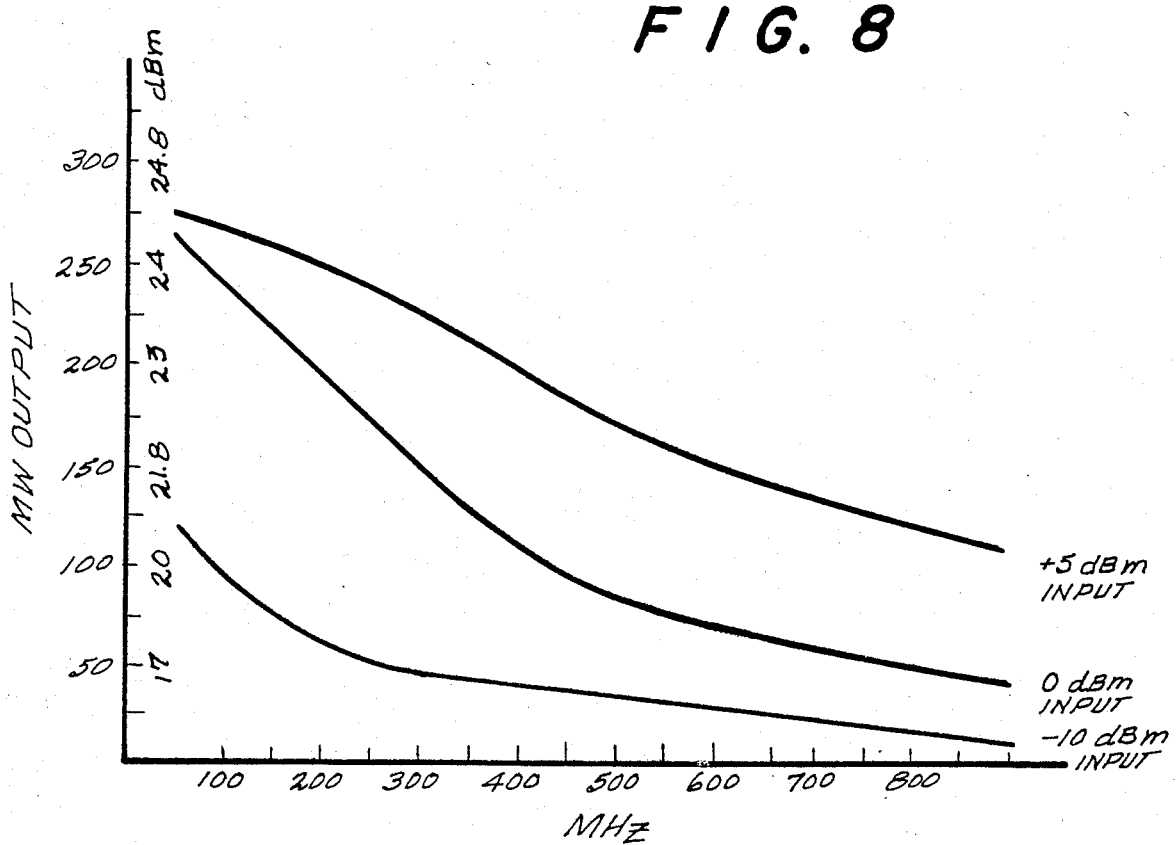
FIG. 8 is a plot of typical power output for various input power levels of the new amplifier over a 100 MHz to 800 MHz frequency range.
Figure 9:
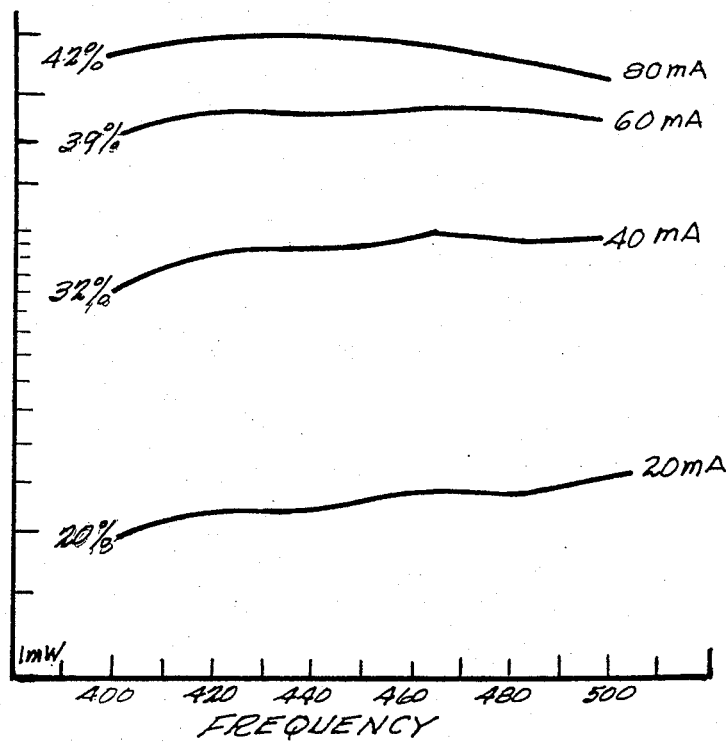
FIG. 9 is a plot of typical operating efficiency of the new amplifier for various applied bias currents over a frequency range of 400 MHz to 500 MHz.

Typical output power curves for frequencies from 100 MHz to 800 MHz for various input power levels are depicted at FIG. 8. FIG. 9 shows typical output power curves (and efficiency) from 400 MHz to 500 MHz for various bias currents. Typical measured input and output impedances over a frequency range from 50 MHz to 860 MHz are presented in Table 1 below:

TABLE 1

| FREQ. (MHz) | INPUT Z R | jx | OUTPUT Z R | jx |
|---|---|---|---|---|
| 50 | 46 | −j38 (83 p) | 64 | −j8.3 (380 p) |
| 130 | 34 | −j24 (51 p) | 51 | −j25 (49 p) |
| 180 | 25 | −j27 (32 p) | 42 | −j22 (41 p) |
| 400 | 11 | −j11 (36 p) | 50 | −j20 (20 p) |
| 512 | 14.8 | +j0.4 (.1 nH) | 23 | −j22 (14 p) |
| 860 | 13.2 | +j1.2 (.2 nH) | 32 | −j35 (5.3 p) |

The new RF amplifier module can now be appreciated as being capable of providing some or all of the following potentially desired characteristics:

* An IC chip which can be fit, if desired, into a 4 leaded microwave package
* The back of the IC chip may be directly tied to ground potential thus improving thermal coupling and simultaneously simplifying IC packaging
* Multiple ground and bias IC pads may be added to ease wire bonding inductance/conductance problems
* Good bias control via a simple external circuit is provided for easily achieving Class A, B or C amplifier operation
* Power level control is also obtained via the same simple bias control and via the same external bias lead connection point
* Input & output capacitance is lowered (less Miller capacitance)
* Input & output capacitance is not so heavily related to gain, load, signal level or frequency (controllable by device design)
* High and stable gain factors (e.g. 15 dB gain at 960 MHz compared to only 5 dB gain for a typical discrete component design)

While only a few embodiments of the present invention have been described in detail above, additional and alternate embodiments and implementation schemes now will be evident to those of ordinary skill in the art. For example, although all of the transistors described are NPN transistors, PNP bipolar junction transistors or field effect transistors (such as gallium arsenide active elements) could be substituted instead. Moreover, in some circumstances, direct connections or other types of circuit elements could be substituted for resistors 74, 76 or 54 if desired. It might be desirable to add additional collector-shorted diodes in series with the one formed by transistor Q3 in order to permit the use of higher supply voltages $V_{cc}$ while still maintaining the capacitance of transistor Q2 at an acceptably low level. As will be readily appreciated, one or more two-terminal elements (i.e. PN junction diodes) could be substituted for at least transistor Q3. While transistors Q1 and Q2 should be fabricated on the same wafer to obtain the current matching described, the other circuit elements, if desired, need not necessarily be included on the same wafer and might thus be discrete external elements for some applications. And additional transistor structures might be added (e.g. connected in parallel to some of those shown in the exemplary embodiments to get higher power capability). Accordingly, these and all such other alternatives which continue to realize at least some of the novel features of this invention are to be considered within the scope of at least the broader ones of the following claims.

What is claimed is:

1. A monolithic integrated circuit amplifier module requiring only four external electrical connections and comprising:

an input signal terminal;
an output signal terminal;
a DC bias input terminal;
a ground reference terminal;
a single common-emitter configured current-gain transistor amplifier having a base electrode directly conductively connected to said input signal terminal and an emitter electrode directly conductively connected to said ground terminal;
a single common-base configured voltage-gain transistor amplifier means connected in cascode with said current-gain amplifier means and having a collector electrode directly conductively connected to said output signal terminal;
said cascoded amplifier means being connected to collectively provide an output signal from the module which is inverted or approximately 180° out-of-phase with respect to an input signal; and
DC biasing means connected to said DC bias input terminal and to each of said transistor amplifier means for establishing DC bias currents within each of said transistor amplifier means.

2. A monolithic integrated circuit amplifier module as in claim 1 wherein:

said current-gain transistor amplifier means consists of a single common-emitter connected first transistor; and
said voltage-gain transistor amplifier means comprises a common-base connected second transistor having an emitter electrode connected to a collector electrode of asid first transistor.

3. A monolithic integrated circuit amplifier module as in claim 2 wherein each of said transistors is a bipolar NPN transistor and each of said cascoded amplifier means consists of only a single transistor structure.

4. A monolithic integrated circuit amplifier module requiring only four external electrical connections and comprising:

an input signal terminal;
an output signal terminal;
a DC bias input terminal;
a current-gain transistor amplifier connected to said input signal terminal and to said ground terminal;
a voltage-gain transistor amplifier connected in cascode with said current-gain amplifier and to said output signal terminal;
said cascoded amplifiers being connected to collectively provide an output from the module which is inveted or approximatley 180° out-of-phase with respect to an input signal to the module;
DC biasing means connected to said DC bias input terminal and to each of said transistor amplifiers for establishing DC bias currents within each of aid transistor amplifiers;
said current-gain transistor amplifier including a common-emitter connected first transistor;
said voltage-gain transistor amplifier including a common-base connected second transistor having an emitter electrode connected to a collector electrode of said first transistor;
each of said transistors being a bipolar NPN transistor and each of said cascoded amplifiers consisting of only a single transistor structure; and
said DC biasing means including a first bias transistor (also a bipolar NPN transistor) connected in a current mirror arrangement with said common-emitter first transistor to establish a DC bias current therein which is multiplied by a factor M when compared to DC current flowing in the first bias transistor;
a second bias transistor (also a bipolar NPN transistor) connected in a shorted base-collector diode arrangement with said DC bias input terminal and said first bias transistor so as to supply DC bias current thereto and to minimize the voltage swing across the current-gain transistor amplifier;
first resistance connected in series between said first and second bias transistors;
second resistance connected in series between the base of said common-emitter first transistor and the collector of said first bias transistor; and
third resistance of value approximately M times said second resistance, connected in series between the base and collector of said second bias transistor.

5. An ac signal amplifier comprising:

an input signal terminal;
an output signal terminal;
a DC bias input terminal;
a ground reference terminal;
first and second transistors connected in a current mirror configuration with the first transistor being coupled to said DC bias terminal to establish a DC bias current through the second transisor and with the second transistor being coupled to said input signal terminal and adapted to provide current-gain amplification of input signals received therefrom; and
a further transistor also coupled to said DC bias terminal to establish a DC bias current therethrough and aid further transistor being connected in cascode with said second transistor to provide voltage-gain amplification of the current-gain amplified signals supplied thereto the second transistor, said further transistor being connected to provide current and voltage gain amplified output signals to said output terminal.

6. An amplifier as in claim 5 wherein a forward-based diode structure and a series resistance couple said DC bias input terminal to said first transistor.

7. An amplifier as in claim 6 wherein said diode structure comprises a base-collector connected transistor.

8. An amplifier as in claim 5 wherein each of said transistors is a bipolar NPN transistor fabricated within the same monolithic integrated circuit wafer.

9. An amplifier as in claim 7 wherein each of said transistors is a bipolar NPN transistor fabricated within the same monolithic integrated circuit wafer.

10. An amplifier comprising:

an input signal terminal;
an output signal terminal;
a DC bias input terminal;
a ground reference terminal;
first and second transistors connected in a current mirror coniguration with the first transistor being coupled to said DC bias terminal to establish a DC bias current through the second transistor and with the second transistor being coupled to said input signal terminal and adapted to provide current-gain amplification of input signals received therefrom;

a further transistor also coupled to said DC bias terminal to establish a DC bias current therethrough and said further transistor being connected in cascode with said second transistor to provide voltage-gain amplification of the current-gain amplified signals supplied thereto through the second transistor, said further transistor being connected to provide current and voltage gain amplified output signals to said output signal terminal;

each of said transistors being a bipolar NPN transistor fabricated within the same monolithic integrated circuit wafer; and wherein said integrated circuit wafer includes at least one electrical connection pad to serve as each of said terminals and wherein at least one of said terminals comprises a plurality of such pads electrically connected in parallel.

11. An RF amplifier as in claim 10 wherein said ground reference terminal comprises a plurality of said pads electrically connected in parallel.

12. An RF amplifier as in claim 11 wherein said DC bias input terminal comprises a plurality of said pads electrically connected in parallel.

13. An amplifier comprising:
an input signal terminal;
an output signal terminal;
a DC bias input terminal;
a ground reference terminal;
first and second transistors connected in a current mirror configuration with the first transistor being coupled to said DC bias terminal to establish a DC bias current through the second transistor and with the second transistor being coupled to said input signal terminal and adapted to provide current-gain amplification of input signals received therefrom;
a further transistor also coupled to said DC bias terminal to establish a DC bias current therethrough and said further transistor being connected to cascode with said second transistor to provide voltage-gain amplification of the current-gain amplified signals supplied thereto through the second transistor, said further transistor being connected to provide current and voltage gain amplified output signals to said output signal terminal;
wherein said second transistor has a signal input which also receives a DC bias established by the first transistor and further comprising a decoupling resistance connected between said signal input of said second transistor and the DC bias establishing first transistor.

14. An RF amplifier as in claim 13 wherein said first and second transistors have geometrically scaled structure to establish current multiplication ratio 1:M therebetween and further comprising a matching resistance included within said current mirror configuration, the ratio between said decoupling and matching resistances being M:1 so as to maintain the 1:M DC current ratio between said first and second transistors in the presence of said decoupling resistance.

15. An amplifier as in claim 5, 6, 7 or 8 wherein said cascoded second and said further transistor collectively provide as output ac signal which is inverted or approximately 180° out of phase with respect to an input ac signal.

16. A monolithic integrated circuit RF amplifier for amplifying signals in excess of 100 MHz, said amplifier being fabricated from a P-type semiconductor substrate starting material and comprising:

a signle voltage RF amplifying transistor for producing an RF voltage across an output thereof directly conductively connected to an output terminal and proportional to an input RF current applied in series with said output;

a signle current RF amplifier transistor having only a single transistor amplifier stage with an output operatively coupled in series with the output of the voltage amplifier transistor and connected to current gain amplify an input RF signal directly conductively connected thereto, for controlling the current applied to said voltage amplifier transistor in response to the input RF signal thereby providing a current and voltage gain amplified RF signal across the collective series-connected outputs of said amplifying transistors having a frequency in excess of 100 MHz; and biasing means connected to each of said amplifying transistors and to a common DC bias input for establishing quiescent biasing current within each of the voltage and current amplifying transistors which is substantially independent of signal level.

17. A monolithic RF amplfier as in claim 16 wherein:
said biasing means includes at least a first transistor; and
said current RF amplifying transistor is connected in a current mirror configuration with said first transistor.

18. A monolithic RF amplifier for amplifying signals in excess of 100 MHz, said amplifier being fabricated from a P-type semiconductor substrate starting material and comprising:

a voltage RF amplifying transistor for producing an RF voltage across an output thereof proportional to an input RF current applied in series with said output;

a single current RF amplifier transistor having only a singel transistor amplifier stage with an output operatively coupled in series with the output of the voltage amplifier transistor and connected to current gain amplify an input RF signal thereto, for controlling the current applied to said voltage amplifier transistor in response to the input RF signal thereby providing a current and voltage gain amplifier RF signal across the collective series-connected outputs of said amplifying transistors having a frequency in excess of 100 MHz; and biasing means connected to each of said amplifying transistors and to a common DC bias input for establishing quiescent biasing current within each of the voltage and current amplifying transistors which is substantially independent of signal level;

said biasing means including at least a first transistor; and said current RF amplifying transistor being connected in a current mirror configuration with said first transistor;

wherein said biasing means further includes at least one diode connected in series with said first transistor to supply bias current thereto and including a resistor connecting the current RF transistor amplifier to the series-connected junction of said diode and said first transistor.

19. An integrated circuit amplifier comprising:
an RF input terminal (B);
a ground terminal (A);
a first transistor (Q1) including a base, a collector and an emitter, the base being coupled to the collector and directly conductively connected to said input terminal (B), and the emitter being coupled to said ground terminal (A);

a second transistor (Q2) including a base, a collector and an emitter, the emitter being coupled to said ground terminal (A), and the base being directly conductively connected to the base of said first transistor (Q2);

a bias input terminal (D);

a diode (Q3) including anode and cathode electrodes, one electrode being coupled to said biasing terminal (D), and the other electrode being coupled to the collector of said first transistor (Q1);

an RF output terminal (C); and a further transistor (Q4) including a base, a collector and an emitter, the collector being directly conductively coupled to said output terminal (C), the base being coupled to said bias input terminal (D), and the emitter being directly conductively coupled to the collector of said second transistor (Q2).

20. An RF amplifier as in claim 19 wherein said first and second transistors have scaled geometries to provide a current mirror structure.

21. An amplifier as in claim 19 wherein the size of the emitter of said second transistor (Q2) is a predetermined multiple of the size of the emitter of said first transistor (Q1).

22. An integrated circuit amplifier comprising:
an input signal terminal (B);
a ground terminal (A);
a first transistor (Q1) including a base, a collector and an emitter, the base being coupled to the collector and to said input signal terminal (B), and the emitter being coupled to said ground terminal (A);
a diode (Q3) including anode and cathode electrodes, one electrode being coupled to said biasing terminal (D), and the other electrode being coupled to the collector of said first transistor (Q1);
an output signal terminal (C);
a further transistor (Q4) including a base, a collector and an emitter, the collector being coupled to said output signal terminal (C), the base being coupled to said bias input terminal (D), and the emitter being coupled to the collector of said second transistor (Q2);
resistance means for coupling the said other electrode of said diode to the collector of said first transistor (Q1).

23. An integrated circuit amplifier comprising:
an input signal terminal (B);
a ground terminal (A);
a first transistor (Q1) including a base, a collector and an emitter; the base being coupled to the collector and to said input signal terminal (B), and the emitter being coupled to said ground terminal (A);
a second transistor (Q2) including a base, a collector and an emitter, the emitter being coupled to said ground terminal (A), and the base being coupled to the base of said first transistor (Q2);
a bias input terminal (D);
a diode (Q3) including anode and cathode electrodes, one electrode being coupled to said biasing terminal (D), and the other electrode being coupled to the collector of said first transistor (Q1);
an output signal terminal (C);
a further transistor (Q4) including a base, a collector and an emitter, the collector being coupled to said output signal terminal (C), the base being coupled to said bias input terminal (D), and the emitter being coupled to the collector of said second transistor (Q2);

a first resistance (R1) connected between the collector of said first transistor (Q1) and the base of said second transistor (Q2); and a second resistance (R2) connected between the base of said first transistor (Q1) and the collector of said first transistor (Q1).

24. An integrated circuit amplifier comprising:
an input signal terminal (B);
a ground terminal (A);
a first transistor (Q1) including a base, a collector and an emitter, the base being coupled to the collector and to said input signal terminal (B), and the emitter being coupled to said ground terminal (A);
a second transistor (Q2) including a base, a collector and an emitter, the emitter being coupled to said ground terminal (A), and the base being coupled to the base of said first transistor (Q2);
a bias input terminal (D);
a diode (Q3) includng anode and cathode electrodes, one electrode being coupled to said biasing terminal (D), and the other electrode being coupled to the collector of said first transistor (Q1);
an output signal terminal (C);
a further transistor (Q4) including a base, a collector and an emitter, the collector being coupled to said output signal terminal (C), the base being coupled to said bias input terminal (D), and the emitter being coupled to the collector of said second transistor (Q2);
resistance means for coupling the said other electrode of said diode to the collector of said first transistor (Q1).

25. An amplifier as in claim 19 wherein said first, second and fourth transistors and said diode are all constructed on a common substrate.

26. An amplifier as in claim 19 wherein said diode comprises a transistors (Q3) including a base, a collector and an emitter, the base being coupled to the collector, said connected collector-base comprising said anode of said diode, the emitter thereof comprising said cathode of said diode.

27. An integrated circuit amplifier comprising:
an input signal terminal (B);
a ground terminal (A);
a first transistor (Q1) including a base, a collector and an emitter, the base being coupled to the collector and to said input signal terminal (B), and the emitter being coupled to said ground terminal (A);
a second transistor (Q2) including a base, a collector and an emitter, the emitter being coupled to said ground terminal (A), and the base being coupled to the base of said first transistor (Q2);
a bias input terminal (D);
a diode (Q3) including anode and cathode electrodes, one electrode being coupled to said biasing terminal (D), and the other electrode being coupled to the collector of said first transistor (Q1);
an output signal terminal (C):
a further transistor (Q4) including a base, a collector and an emitter, the collector being coupled to said output signal terminal (C), the base being coupled to said bias input terminal (D), and the emitter being coupled to the collector of said second transistor (Q2);

bypass capacitor means, connected externally between said biasing terminal (D) and ground potential, for maintaining said biasing terminal at ground potential with respect to signal frequencies; and
external means for applying a DC biasing current to said biasing terminal (D).

28. A monolithic integrated circuit ac signal amplifier module comprising:
signal input and output terminals;
a DC bias input terminal;
two cascoded signal amplifying transistors including a single current-gain stage transistor feeding a single voltage-gain stage transistor, said cascoded transistors collectively providing signal inversion as well as current and voltage gain between said signal input and output terminals; to which said transistors are respectively connected by direct conductive connections; and
common DC bias control means connected to said bias input terminal and to said transistors to simultaneously control DC bias quiescent operating points for both said transistors.

29. A monolithic integrate circuit amplifier comprising:
signal input and signal output terminals;
a DC bias input terminal;
two cascoded signal amplifying transistors including a current-gain stage transistor feeding a voltage-gain stage transistor, said cascoded transistors collectively providing signal inversion as well as current and voltage gain between said signal input and signal output terminals; and
common DC bias control means connected to said bias input terminal and to said transistors to simultaneously control DC bias quiescent operating points for both said transistors;
said common DC bias control means including
a current-mirror transistor connected in current-mirror relationship with the current-gain stage transistor; and
a forward-biased diode and resistance connected in series with said current-mirror transistor.

30. A monolithic integrated circuit RF amplifier as in claim 29 further comprising:
decoupling resistance connected in series between said current-mirror transistor and said current-gain stage transistor to increase the input impedance of the RF input terminal otherwise lowered by said forward-biased diode.

31. A monolithic integrated circuit RF amplifier as in claim 29 or 30 wherein said amplifier is packaged within a four leaded Micro-X integrated circuit package providing only four external electrical connection points.

32. An amplifier comprising:
an input signal terminal;
an output signal terminal;
a DC bias input terminal;
a ground reference terminal;
first and second transistors connected in a current mirror configuration with the first transistor being coupled to said DC bias terminal to establish a DC bias current through the second transistor and with the second transistor being coupled to said input signal terminal and adapted to provide current-gain amplification of input signals received therefrom;
a further transistor also coupled to said DC bias terminal to establish a DC bias current therethrough and said further transistor being connected in cascode with said second transistor to provide voltage-gain amplification of the current-gain amplified signals supplied thereto through the second transistor, said further transistor being connected to provide current and voltage gain amplified output signals to said output signal terminal;
a forward-biased diode structure and a series resistance coupling said DC bias input terminal to said first transistor;
said diode structure including a base-collector connected transistor;
each of said transistors being a bipolar NPN transistor fabricated within the same monolithic integrated circuit wafer; and
wherein said integrated circuit wafer includes at least one electrical connection pad to serve as each of said terminals and wherein at least one of said terminals comprises a plurality of such pads electrically connected in parallel.

33. A monolithic integrated circuit amplifier comprising:
signal input and signal output terminals;
a DC bias input terminal;
two cascoded signal amplifying transistors including a current-gain stage transistor feeding a voltage-gain stage transistor, said cascoded transistors collectively providing signal inversion as well as current and voltage gain between said signal input and signal output terminals; and
common DC bias control means connected to said bias input terminal and to said transistors to simultaneously control DC bias quiescent operating points for both said transistors;
wherein said amplifier is packaged within a four leaded Micro-X integrated circuit package providing only four external electrical connection points.

34. A monolithic integrated circuit ac signal amplifier module comprising:
signal input and output terminals;
a DC bias input terminal;
two cascoded signal amplifying transistors including a current-gain stage transistor feeding a voltage-gain stage transistor, said cascoded transistors collectively providing signal inversion as well as current and voltage gain between said signal input and output terminals; and
common DC bias control means connected to said bias input terminal and to said transistors to simultaneously control DC bias quiescent operating points for both said transistors;
said bias control means including a predetermined decoupling resistance network means connection to at least one of said transistors, which network acts to decouple the bias control means from the signal being amplified.

35. A monolithic integrated circuit ac signal amplifier module as in claim 34 wherein said bias control means includes a current mirror bias transistor and said resistance network means comprises a pair of resistances having predetermined scaled resistance values corresponding to the current mirror ratio established between said current mirror bias transistor and said at least one of said transistors.

36. A monolithic integrated circuit ac signal amplifier module comprising:
signal input and output terminals;
a DC bias input terminal;

two cascoded signal amplifying transisors including a current-gain stage transistor feeding a voltage-gain stage transistor, said cascoded transistors collectively providing signal inversion as well as current and voltage gain between said signal input and output terminals; and common DC bias control means connected to said bias input terminal and to said transistors to simultaneously control DC bias quiescent operating points for both said transistors;

said module including at least one electrical connection pad to serve as each of said terminals and wherein at least one of said terminals comprises a plurality of such pads electrically connected in parallel.

37. A monolithic integrated circuit ac signal amplifier module comprising:

signal input and output terminals;

a DC bias input terminal;

two cascoded signal amplifying transistors including a current-gain stage transistor feeding a voltage-gain stage transistor, said cascoded transistors collectively providing signal inversion as well as current and voltage gain between said signal input and output terminals;

common DC bias control means connected to said bias input terminal and to said transistors to simultaneously control DC bias quiescent operating points for both said transistors;

bypass capacitor means, connected externally between said biasing terminal and ground potential, for maintaining said biasing terminal at signal ground potential; and external means for applying a DC biasing current to said biasing terminal.

* * * * *